United States Patent [19]

Krake

[11] 4,135,397
[45] Jan. 23, 1979

[54] LEVEL MEASURING SYSTEM

[76] Inventor: Guss L. Krake, 6939 Harriet Ave. S., Minneapolis, Minn. 55423

[21] Appl. No.: 803,226

[22] Filed: Jun. 3, 1977

[51] Int. Cl.² ............................................. G01F 23/28
[52] U.S. Cl. .............................. 73/290 R; 324/58.5 B; 73/304 R
[58] Field of Search ................. 324/58.5 B; 73/290 R, 73/304 R

[56] References Cited

U.S. PATENT DOCUMENTS

| | | | |
|---|---|---|---|
| 3,424,002 | 1/1969 | Johnson | 73/290 R |
| 3,474,337 | 10/1969 | Petrick | 73/304 R X |
| 3,695,107 | 10/1972 | Hertz et al. | 73/290 R |
| 3,703,829 | 11/1972 | Dougherty | 73/290 R |
| 3,832,900 | 9/1974 | Ross | 73/290 R |
| 3,853,005 | 12/1974 | Schendel | 73/290 R |
| 3,922,914 | 12/1975 | Fuchs | 324/58.5 B X |
| 3,995,212 | 11/1976 | Ross | 324/58.5 B |

*Primary Examiner*—Stanley T. Krawczewicz
*Attorney, Agent, or Firm*—Hugh D. Jaeger

[57] ABSTRACT

A system for measuring the height of material in a storage container by generating an incident pulse with a pulse generator and transmitting the pulse through a high impedance transmission line supported in a container. A reflected pulse of opposite polarity is generated at the interface of air and material in the container and is received by a reflected pulse detector which again triggers the pulse generator to continuously monitor the height of the material in the container. The time difference between the transmitted incident pulse and the received reflected pulse of opposite polarity is the indication of the height of the material in the container. A hold off delay disables the reflected pulse detector for a finite period of time so that the reflected pulse detector is not affected by noise signals on the transmission line. If no material is in the container and no reflected pulse of opposite polarity is received, then one automatic start pulse generator retriggers the pulse generator. An auxiliary transmission line of equal length to that in the container is used to calibrate the measuring system.

9 Claims, 2 Drawing Figures

LEVEL MEASURING SYSTEM

CROSS REFERENCES TO CO-PENDING APPLICATIONS

None

BACKGROUND OF THE INVENTION

1. Field of the Invention

The present invention relates generally to improvements in an electrical measuring system, and more particularly, pertains to a new and improved measuring system for determining the height of material in a container such as determining the height of grain in an elevator.

2. Description of the Prior Art

Those concerned with the development of grain measuring systems have long recognized the need for an accurate, simple, and reliable measuring system to measure the height of a material in a container, particularly grain or a similar product in an elevator.

Prior art systems in the past have been unsatisfactory in failing to accruately and continuously measure the volume of material in a container or in this particular application, the height of grain in an elevator. One type of prior art device to measure height of grain in a grain elevator was an electric motor having a weighted cable. The number of revolutions of the shaft are counted until the weighted cable reaches the top of the material which is proportional to the height of the material in the elevator. Such device is unsatisfactory in that the system is unreliable and always breaking down. Another type of prior art practice is measuring the height of grain in a grain elevator with Sonar, but due to the noisy environment conditions particularly when the grain elevator is being filled, is unsatisfactory in not providing an accurate measurement of height. A further type of prior art practice is to measure the change of inductance in a tuned wire resonant frequency circuit. This practice proved to be unsuitable due to moisture sensitivity, temperature sensitivity, and maintaining the resonant circuit in the grain elevator in calibration. Still another type of prior art practice is to measure the resistance and/or the capacitance between two hanging conducts but this practice proved to be less than desirable due to the variations in the type of grain, the moisture content of the grain, and upon the quantity of dust.

The measuring system of this invention utilizes a high impedance transmission line wound by material and measures the time between an incident pulse and a reflected pulse of opposite polarity occurring at the interface of the air and the material which is directly proportional to the height of the grain in the elevator.

SUMMARY OF THE INVENTION

The present invention obviates the foregoing disadvantages of the prior art measuring devices by providing an accurate measuring system to determine the height of material in a container, particularly grain in a grain elevator.

According to one embodiment of the present invention, there is provided a measuring system for determining the height in a container such as grain in a grain elevator having a pulse generator, a high impedance transmission line connected to said pulse generator and supported in a container such as a grain elevator, and a reflected pulse detector connected to the transmission line whereby the time between the incident pulse and the reflected pulse of opposite polarity occurring at the interface of the air and the material in the container is proportional to the height of the material in the container. Also, a hold off delay connected to the reflected pulse detector disables the reflected pulse detector for a predetermined time interval so that the detector does not detect noise signals. Further, in the event of no material in the container and therefore, no returned reflections, an automatic start pulse generator provides for continuous monitoring of the height of the material in the container.

Having briefly described the embodiment of the present invention, it is a principal object thereof to provide a new and improved measuring system.

An object of the present invention is to provide a measuring system for measuring the increasing or decreasing height of material in a container as well as the static level of the material in the container. The height of the material is directly related to the volume of material in the container. The material may be of any type having a permeability (magnetic) property, permittivity (dielectric) property, or a conductivity (conducting) property. For then, the material may be solid medium, liquid medium, or gaseous medium having a density greater than air.

Another object of the invention is to specifically provide a measuring system for measuring the height of grain or other similar product in a grain bin, also referred to as an elevator or silo in the trade.

A further object of the invention is to provide a measuring system utilizing a transmission line supported in the bin having a large external field such that incident pulses transmitted through the line have reflected pulses at the interface between the air and the material. The time interval between the incident pulses is proportional to the height of the material in the container, or grain in the elevator for the intended use.

Still another object of the invention is to provide a system for accurate and continuous measurement of the height of material in the container, or the grain in the elevator for the intended use.

A significant aspect and feature of the invention is the utilization of a high impedance transmission line supported by the container which gives rise to a reflected pulse of opposite polarity for each incident pulse occurring at the interface of the air and the material.

Another significant aspect and feature of the invention is the utilization of a high impedance transmission line supported in a container by any well known means in the art having a large external field surrounding the transmission line.

BRIEF DESCRIPTION OF THE DRAWING

Other objects and many of the attendant advantages of this invention will be readily appreciated as the same becomes better understood by reference to the following detailed description when considered in connection with the accompanying drawings, in which like reference numerals designate like parts throughout the figures thereof and therein:

FIG. 1 illustrates a block diagram of the preferred embodiment of the invention, and;

DESCRIPTION OF THE PREFERRED EMBODIMENT

Figure 2:
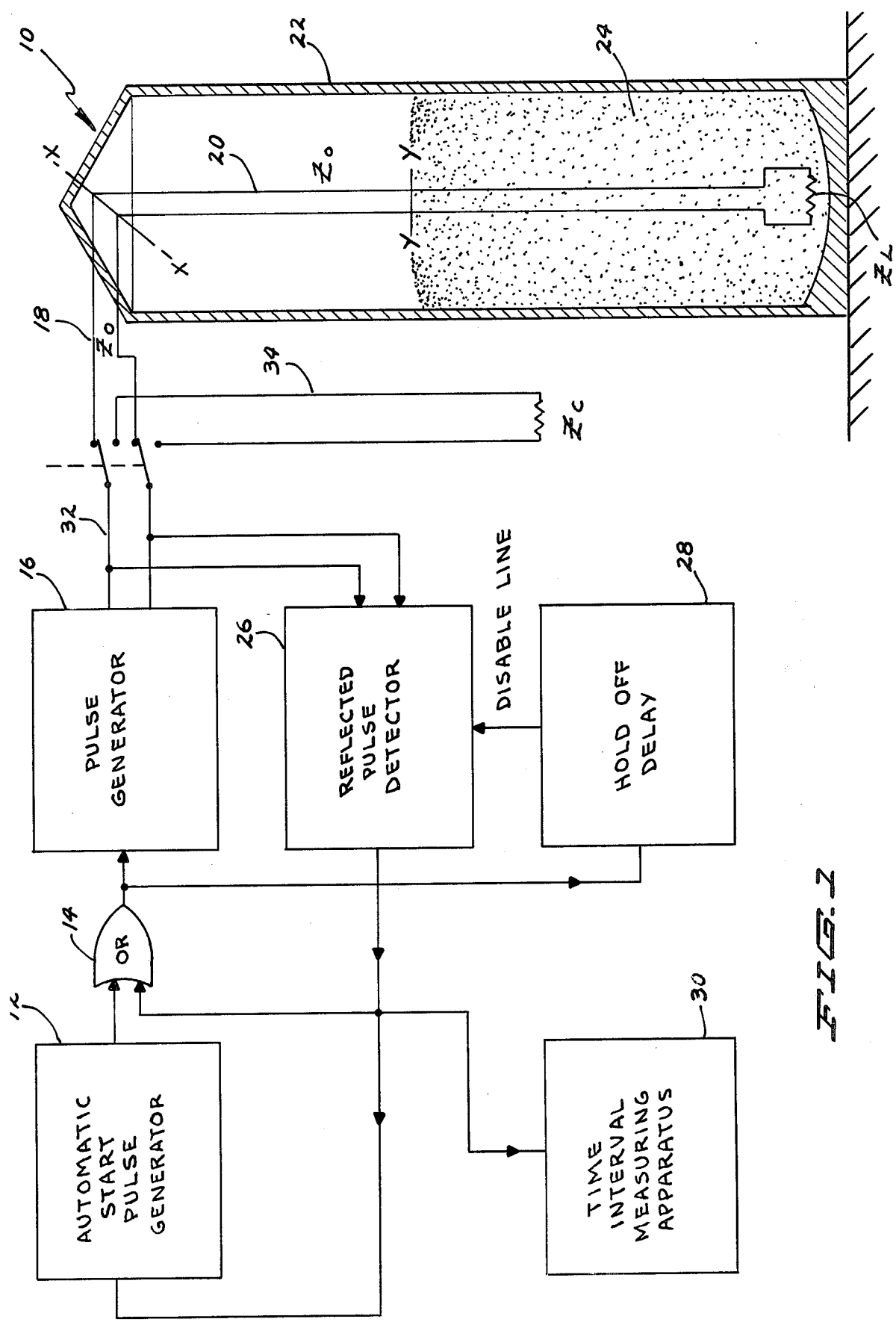
FIG. 2 illustrates an electrical circuit schematic of the invention.
Figure 2:
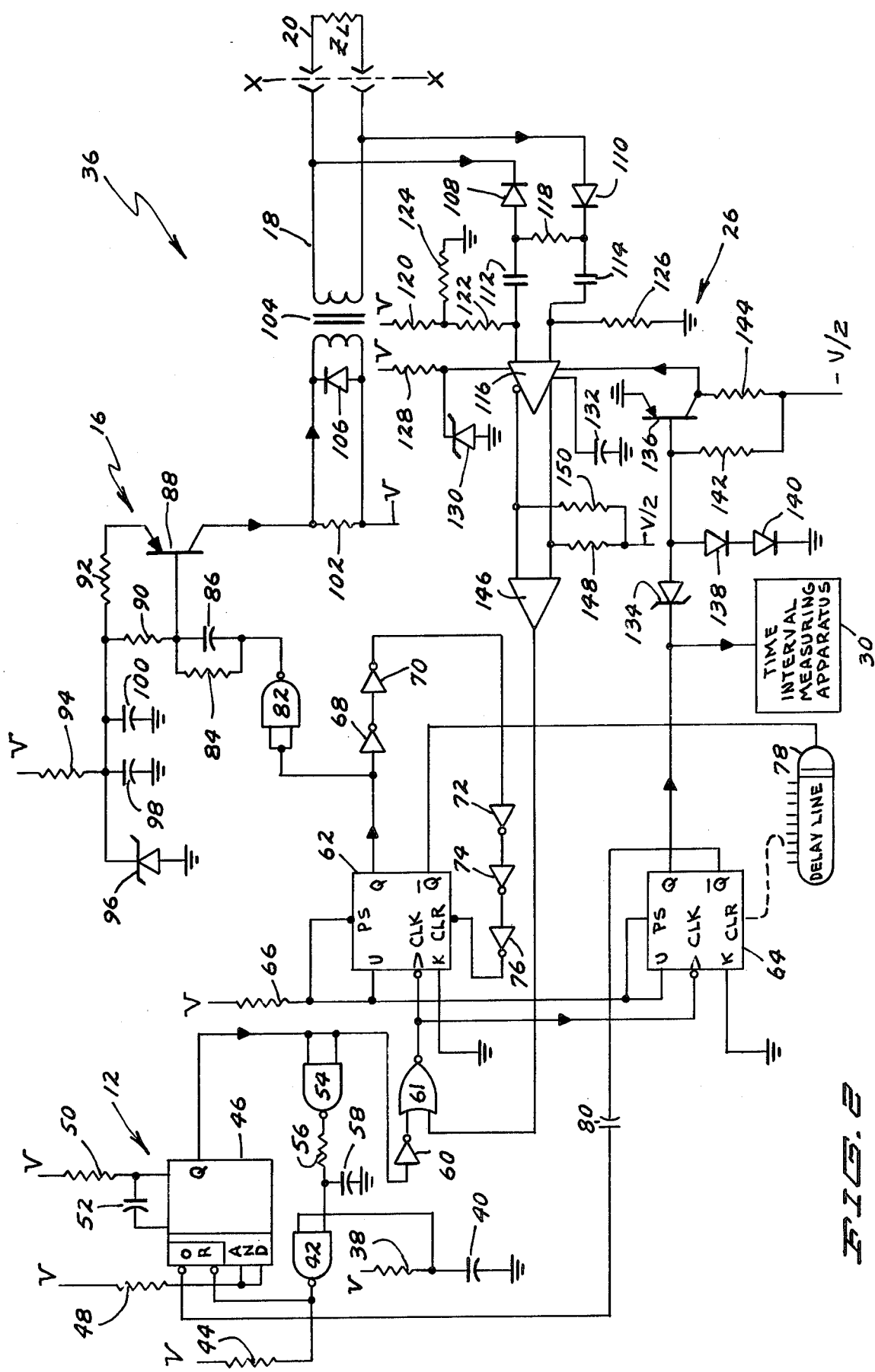

FIG. 1 illustrates a block diagram of a preferred embodiment of the invention, a measuring system 10 for measuring the height of material in a container, or in this embodiment, grain in an elevator. An automatic start pulse generator 12 connects to an OR gate 14. A pulse generator 16 connects to the output of OR gate 14. A coaxial cable feed line 18 having characteristic impedance Zo connects the pulse generator 16 to a high impedance transmission line 20 having a characteristic impedance Zo and is suitably supported in a container 22 by any well known means in the art. A load impedance $Z_L$ equal to the characteristic line impedance terminates the transmission line 20. The automatic start pulse generator 12 triggers pulse generator 16 to transmit an incident pulse on the feed line 18 through the connecting junction X—X of the high impedance transmission line 20. The incident pulse generates a large external field surrounding the high impedance transmission line 20. At the interface Y—Y between the air and the material 24 such as grain in the elevator 22 a reflected pulse of opposite polarity to the incident pulse occurs due to the discontinuity which travels back on the transmission line 20 and through the feed line to a reflected pulse detector 26 which connects to the feed line 18. A hold off delay 28 connects between the junction of the OR gate 14 and the pulse generator 16 to the reflected pulse detector 26, and disables the reflected pulse detector 26 during the time of travel of the incident pulse on the feed line 18 so that the reflected pulse pulse detector is not detecting noise signals. A time interval measuring apparatus 30 connects to the output of the reflected pulse detector 26 to measure the time intervals between reflected pulses which is inversely proportional to the height of the material 24 in the container 22 when the transmission feed line junction X—X is at the top of the container or is directly proportional to the height of the material in the container when the transmission feed line junction X—X is at the bottom of the container. The time interval measuring apparatus 30 converts the time interval information into volume of material in the container. A calibration line 34 is connected to the pulse generator 16 through a switch 32. An impedance Zc which is less than the characteristic impedance Zo of the feed line 18 terminates the calibration line 34 to give rise to a reflected pulse of opposite polarity to the incident pulse for purposes of calibrating the measuring system 10. The length of the calibration line 34 is equal in length to the feed line 18.

The switch 32 may have a multitude of poles to accommodate a plurality of feed lines 18 all of equal length for an equal plurality of transmission lines 20 corresponding to an equal plurality of respective containers 24. A particular example would be a multitude of grain elevators. The electrical circuitry of elements 12, 14, 16, 26, and 28 may be positioned and centered at the top of the containers 22 while the time interval measuring apparatus 30 can be located conveniently at ground level to an operator.

FIG. 2 illustrates an electrical schematic 36 of the preferred embodiment of the invention, the measuring system 10. A set resistor 38 connects from a voltage source V to one input of a NAND gate 42. A trigger capacitor 40 connects between the one input of the NAND gate 42 and ground. A set resistor 44 connects between the voltage source V and one input of an internal OR gate of a one shot multivibrator 46. The output of the NAND gate 42 also connects to the one input of the internal OR gate of multivibrator. A set resistor 48 connects between the voltage source V and both gates of an internal AND gate of the one shot multivibrator 46. A resistor 50 and a capacitor 52 forming a RC network connect between the voltage source V and the timing input of the one shot multivibrator 46. The Q output connects to both inputs of a NAND gate 54. A resistor 56 connects the output of the NAND gate 54 to the other input of the NAND gate 42. A timing capacitor 58 forming a RC network with the resistor 56 resistor 56 and the other input of the NAND gate 42 to ground. The Q output of the one shot multivibrator 46 also connects to an inverter 60 which connects to one input of the NOR gate 61, also shown as 14 in FIG. 1. The above circuitry constitutes the automatic start pulse generator of FIG. 1.

The output of the NOR gate 61 connects to the clock input of one shot multivibrators 62 and 64. A set resistor 66 connects between the voltage source V and the preset and J input of the one shot multivibrators 62 and 64. The K input of the one shot multivibrators 62 and 64 are grounded. The Q output of the one shot multivibrator 62 connects to inverters 68 through 76 in series. The output of the last inverter 76 connects to the clear of the one shot multivibrator 62. The odd number of inverters makes the JK flip-flop into the one shot multivibrator 62. The $\overline{Q}$ output of the one shot multivibrator 62 connects to a delay line 78 whose output connects to the clear of the one shot mulivibrator 64. A coupling capacitor 80 connects between the Q output of the one shot multivibrator 64 and the other input of the internal OR gate of the one shot multivibrator 46.

The multivibrator 64, the delay line 78, and the coupling capacitor 80 comprises the hold off delay 28 of FIG. 1. The Q output of the one shot multivibrator 62 also connects to both inputs of a NAND gate 82. A resistor 84 and a capacitor 86 in parallel connect between the base of a high speed-high current switching transistor 88 and the NAND gate 82. Resistors 90 and 92 connect in series between the base and the collector of the transistor 88 respectively. A voltage biasing resistor 94 connects between the voltage source V and the junction of the resistors 90 and 92. A zener diode 96 connects between the junction of the resistors 90–94 and ground. A bypass capacitor 98 and a filtering capacitor 100 connect between the junction of resistors 90–94 and ground. A resistor 102 connects between the minus voltage source V and the emitter of the transistor 88. The primary of a matching transformer 104 connects across the resistor 102 and a secondary of the transformer 104 connects to the feed line 18 which subsequently connects to the transmission line 20 at the junction X—X as shown in FIG. 1. A clamp diode 106 with its cathode connected to the emitter of the transistor 88 connects across the primary winding of the transformer 104. The multivibrator 62 to the switching transistor 88 and associated circuitry constitutes the pulse generator 16 of FIG. 1.

The reflective pulses of opposite polarity to the incidental pulse on the feed line 18 pass through blocking diodes 108 and 110 and capacitors 112 and 114 to both inputs of a high speed pulse amplifier 116. The diodes 108 and 110 have a low forward voltage drop to block high amplification pulses from the high speed amplifier 16. A resistor 118 connects between the junction of the diode 108 and the capacitor 112 and a junction of the diode 110 and the capacitor 114. Resistors 120 and 122 connect in series between the voltage source V and one input of the high speed pulse amplifier 116 along with a resistor 124 which connects between the junction of the resistor 120 and 122 to ground, all of the resistors for biasing. A resistor 126 connects between the other input of the high speed pulse amplifier and ground. A resistor 128 connects between the voltage source V and the power input of the high speed pulse amplifier 116. A zener diode 130 connects between ground and the power input of the high speed pulse amplifier 116. A bypass capacitor 132 connects between the high speed pulse amplifier and ground.

The Q output of the one-shot multivibrator 64 connects to the time interval measuring apparatus 30 and the cathode of a zener diode 134. The anode of the zener diode 134 connects to the base of a transistor 136. The anode of a diode 138 connects to the base of the transistor 136 and is in series with a diode 140 whose cathode connects to ground. Resistors 142 and 144 connect from the minus voltage source to the base and the collector of the transistor 136.

Both outputs of the high speed pulse amplifier 116 connect to respective inputs of a level converter 146. Resistors 148 and 150 connect between the minus one-half voltage source and the respective inputs of the level converter 146, respectively. The output of the level converter 146 connects to the other input of the OR gate 14. The high speed pulse amplifier 116, the level converter 146, the transistor 136, and associated circuitry constitute the reflected pulse detector 26.

PREFERRED MODE OF OPERATION

Referring to FIG. 1 and FIG. 2, the automatic start pulse generator 12 of FIG. 1 initiates the operation of the measuring system 10. The automatic start pulse generator 12 of FIG. 1 comprises the one-shot multivibrator 46 along with NAND gates 54 and 42 with compensation for the delay internal to the multivibrator 46. Upon energization of the circuit 36 of FIG. 2, the charge of capacitor 40 rises slowly through resistor 38 to initiate a first trigger signal through the NAND gate 42 connected to one input of the internal OR gate of the one-shot multivibrator 46. The output signal of the one-shot multivibrator 46 is coupled through the OR gate 14 shown in both FIGS. 1 and 2 to the clock input of the one-shot multivibrator 62. The incoming trigger pulse makes Q of the one-shot multivibrator 62 go high which connects to the NAND gate 82 which acts as an inverter with the output going low to turn on the base of the switching transistor 88 to output a high current-high speed pulse. The Q output of the one-shot multivibrator 62 is cleared by an odd number of inverters 68–76 in this example which pulls the clear low and transforms the JK flip-flop into the one-shot multivibrator 62. Any odd number of inverters 68 through 76, more or less than the number 5 as shown for way of example and purposes of illustration only, may be utilized for proper timing of the one-shot multivibrator to switch the transistor 88 to produce the incident pulse for the transmission line 20. The pulse generator 16 of FIG. 1 comprises the one-shot multivibrator 62, the inverters 68 through 76, and NAND gate 82 used as an inverter 82, and the switching transistor 88 along with the additional associated biasing, filtering, and bypass circuitry.

The incident pulse from the switching transistor 88 is transformed by the transformer 104 into a large pulse having an extremely fast rise time. The pulse travels down the feed line 18 which connects to the transmission line 20 at the junction X—X and is suitably supported in the bin 24 of FIG. 1.

The transmission line 20 having characteristic impedance is a critical part of the system in that the line impedance is chosen to be large so that as much of the electromagnetic field generated by the incident pulse on the transmission line is external to the physical area of the line. This is required so that as much interaction with the material will occur at the interface phase Y—Y. The larger the external field, the larger the affect of the material on the filed and the larger the reflected pulse of opposite polarity of the incident pulse which occurs at the interface Y—Y between the air and the material 24. The presence of material surrounding the transmission line 20 decreases the impedance of the transmission line 20 and results in a reflected pulse of opposite polarity of the interface of the air and the material. The transmission line is usually suspended in the bin 22 from the top downward towards the bottom with suitable hardware well known in the art. The transmission line 20 must have a high strength so that the mechanical forces placed on it by the incoming and outgoing material 24 does not cause it to break or vary in its physical and mechanical properties.

The reflective pulse of opposite polarity to the incident pulse is coupled from the junction X—X of the feed line 18 and the transmission line 20 or at any other suitable point on the feed line 18 into a reflected pulse detector 26 or FIG. 1 comprising the high speed pulse amplifier 116 and if required, the level converter 146.

Depending upon the type of integrated circuitry or transistor logic utilized, the level converter 146 may not be required. The high speed pulse amplifier 116 amplifies the reflected pulse which is fed to the other input of the OR gate 14 of both FIGS. 1 and 2.

When the one-shot multivibrator 62 transmits an incident pulse, the Q̄ output goes through a delay line 78 to the clear of the one-shot multivibrator 64. The delay line 78 along with the multivibrator 64 comprises the hold off delay 28 of FIG. 1 to disable the high speed pulse amplified 116 during the period of time that the incident pulse travels down feed line 18 to the junction X—X and returns so that the high speed pulse amplifier 116 does not sense noise signals which it is susceptible to due to the use of a high impedance transmission line 20.

The use of the high impedance transmission line 20 is extremely susceptible to external noises and for this reason, the hold off delay 28 of FIG. 1 disables the high speed pulse amplifier 116 during the time of travel of the incident pulse down the feed line 18 and time for return from the junction X—X. The zener diode 134 is used as a level shifter; the diodes 138 and 140 are used to prevent a breakdown of the emitter-base junction of the transistor 136. The transistor 136 is a switching transistor to control and switch the high speed pulse amplifier 116 on and off during the disable period of the hold off delay 28.

The triggering of the one-shot multivibrator 64 from the high speed pulse amplifier 116 through the NOR gate 61 is connected to the time interval measuring apparatus 30. The measurement between the trigger intervals is related to the height of the material in the bin 22 when a reflected pulse of opposite polarity to the incident pulse occurs at the Y—Y interface between the air and the material 24 in the bin 22 thereby triggering the multivibrator 64. The time interval measuring apparatus 30 consists of the trigger signals being fed through a flip-flop which connects to a high frequency AND gate with the other input being connected to a high frequency oscillator. The AND gate connects to a counter. The trigger signals from the multivibrator 64 toggle the flip-flop to permit the counter to count the frequency signal for an interval of time corresponding to a height in the container. The frequency of the oscillator is predetermined so that it scales the count of the counter into the height of the bin. Any other suitable means well known in the art such as a microprocessor may be utilized to process the trigger signals to obtain height information in the container. The microprocessor system can interface with the elevator's computer control system.

If no material is in the bin 22 and therefore surrounding the transmission line 20, the incident pulse propagates to the end of the transmission line 20 and is dissipated by the impedance load $Z_L$. In this instance, there is no reflected signal and the measuring system restarts itself through the automatic start pulse generator 12 of FIG. 1 consisting of the one-shot multivibrator 46 and the AND gates 42 and 54. When there is no return signal from the one-shot multivibrator 64, the one-shot multivibrator 46 is not retriggered and times out through the resistor 56 connected between the AND gate 42 and 54, respectively, and the capacitor 58 connected to ground. The resistor 50 and the capacitor 52 forms the RC circuit which connects to the timing input of the one-shot multivibrator 46 and results in the one-shot multivibrator 46 retriggering the one-shot multivibrator 62, the pulse generator 16 of FIG. 1. With this type of condition, the pulse repetition rate is low and well outside the normal operation range indicating that the bin 22 is in an empty condition storing no material.

When material begins filling the bin 22 and surrounding the transmission line 20, the impedance of the transmission line 20 is changed at the interface between the air and the material at line Y—Y resulting and giving rise to reflected pulses of opposite polarity to the incoming incident pulse. To give rise to the reflected pulse at the interface, it is only necessary that the material have a permeability, a permittivity or a conductivity different from air. When the interface gives rise to a reflected pulse, the remainder of the incident pulse continues to propogate along the immersed portion of the transmission line 20 in the material 24 to be dissipated in the impedance load $Z_L$. While a portion of the incident signal may be partially reflected, that portion has the same polarity as the original pulse but is dissipated in the pulse generator 16 which has a source impedance equal to the transmission line impedance and therefore all reflective pulses of the same polarity of the incident pulses are absorbed and are not again wholly or partially reflective.

Each time that the one-shot multivibrator 62 is retriggered by the high speed pulse amplifier 116, the reflective pulse detector 26 of FIG. 1, the one-shot multivibrator 46, the automatic start pulse generator 12 of FIG. 1, is also retriggered at one of the inputs of the internal OR gate through the $\bar{Q}$ output of the one-shot multivibrator 64. As long as the one-shot multivibrator 46 is retriggered, it does not generate a trigger signal for the one-shot multivibrator 62, pulse generator 16 of FIG. 1.

The circuitry 36 automatically accounts for time between triggers which depends on time delays in the delay through the high speed pulse amplifier 116, the level converter 146, the OR gate 14, and the one shot multivibrator 62. Further, there is an inherent time delay in the feed line 18 and the transmission line 20. The trigger signals will be closer together when the interface Y—Y between air and the material 24 in bin 22 is closer to the pulse generator 16. The specific example, as shown in FIG. 1, is the higher the material 24 in the bin 22, the faster the pulse rate indicating a large volume. While the specific embodiment has shown the junction of the feed line 18 and the transmission line 20 at the top of the bin 22, the junction X—X may also be located at the bottom of the bin 22 with the impedance load $Z_L$ at the top of the bin 22.

By utilizing the calibration transmission line 34 that is equal in length to the distance from the pulse generator 16 to the position X—X of the junction of the feed line 18 and the transmission line 20, the system generates a calibration value which provides a measure of the circuitry time delays and the time delay from the pulse generator 16 to the junction X—X in each of the bins 22. By proper internal time delays set up in the circuitry 36, the system can compensate for internal circuitry time delays, temperature, humidity, and atmospheric variations.

Various modifications can be made to the measuring system of the present invention without departing from the apparent scope thereof. The described invention can be expanded to any plurality of bins 22 and is only limited by the number of the switch 32.

Having thus described the invention, what is claimed is:

1. A measuring system for determining the height of a material in a container comprising:
   a. container means for storing a material, a high impedance transmission line means supported in said container means, and load impedance means terminating one end of said high impedance transmission line means;
   b. feed line means connected to the other end of said high impedance transmission line means;
   c. pulse generator means connected to feed line means to generate a train of incident pulses which propagate an external electromagnetic field surrounding said high impedance transmission line means;
   d. reflected pulse detector means connected to said feed line means to receive reflected pulses of opposite polarity of said incident pulses from said high impedance transmission line means occurring at an interface of the air and said material in said container means;
   e. trigger means connected to said pulse generator means and triggered by each of said reflected pulses from said reflected pulse detector means;
   f. start pulse generator means connected to said trigger means;
   g. hold off delay means connected between said pulse generator means and said reflected pulse detector means; and,
   h. time interval measuring means connected to said reflected pulse detector means whereby said start pulse generator means triggers said pulse generator means through said trigger means to generate train of incident pulses down said high impedance transmission line means to subsequently propagate an external electromagnetic field surrounding said transmission line means, said hold off delay means disables said reflected pulse detector means during the time of travel of each of said incident pulses from said pulse generator means to a junction of said feed line means and said high impedance transmission line means and time of travel of each of said reflected pulses from said junction to said reflected pulse detector means so that said reflected pulse detector means is not triggered by noise signals during said time of travel, and said time interval measuring means measures the time between said incident pulse and said reflected pulse occurring at the interface of the air and said material in said container, said time interval being directly proportional to said height of said material in said container.

2. A measuring system for determining the height of a material in a container comprising:
   a. container means for storing a material, a high impedance transmission line means supported in said container means, and load impedance means terminating one end of said high impedance transmission line means;
   b. feed line means connected to the other end of said high impedance transmission line means;
   c. pulse generator means connected to said feed line means to generate a train of incident pulses which propagate an external electromagnetic field surrounding said high impedance transmission line means;
   d. reflected pulse detector means connected to said feed line means to receive reflected pulses of opposite polarity of said incident pulses from said high impedance transmission line means occurring at an interface of the air and said material in said container means;
   e. trigger means connected to said pulse generator means and triggered by each of said reflected pulses from said reflected pulse detector means;
   f. start pulse generator means connected to said trigger means to trigger said trigger means;
   g. hold off delay means connected between said pulse generator means and said reflected pulse detector means;
   h. time out means connected between said reflected pulse detector means and said start pulse generator means; and,
   i. time interval measuring means connected to said reflected pulse detector means whereby said start pulse generator means triggers said pulse generator means through said trigger means to generate a train of incident pulses down said high impedance transmission line means to subsequently propagate an external electromagnetic field surrounding said transmission line means, said hold off delay means disables said reflected pulse detector means during the time of travel of each of said incident pulses from said pulse generator means to a junction of said feed line means and said high impedance transmission line means and time of travel of each of said reflected pulses from said junction to said pulse detector means so that said reflected pulse detector means is not triggered by noise signals during said time of travel, said time interval measuring means measures the time between said incident pulse and said reflected pulse occurring at the interface of the air and said material in said container, said time interval being directly proportional to said height of said material in said container, said reflected pulse detector means retriggers said pulse generator through said trigger means, and said time out means retriggers said start pulse generator means in the event that a reflected pulse is not received by said reflected pulse detector means as the incident pulses are dissipated by said load impedance means when said container is empty of said material.

3. The measuring system of claim 2 wherein said pulse generator means comprises a one shot multivibrator whereby said multivibrator is triggered by either said reflected pulse detector means or said trigger means.

4. The measuring system of claim 2 wherein said reflected pulse detector means comprises a high speed pulse amplifier.

5. The measuring system of claim 2 wherein said hold off delay means comprises a one shot multivibrator in series with a delay line connected between said pulse generator means and said reflected pulse detector means.

6. The measuring system of claim 2 wherein said start pulse generator means comprises a one shot multivibrator.

7. The measuring system of claim 6 wherein said time out means comprises a resistor-capacitor network connected to a timing input of said one shot start pulse generator multivibrator whereby said start pulse generator multivibrator triggers said trigger means when said resistor-capacitor network reaches charge.

8. The measuring system of claim 2 wherein said trigger means comprises an OR gate.

9. The measuring system of claim 2 wherein said high impedance transmission line means, said feed line means, and said load impedance means are equal to the characteristic impedance of said high impedance transmission line.

* * * * *